United States Patent
Chu

(10) Patent No.: US 9,329,398 B2
(45) Date of Patent: May 3, 2016

(54) STEREOSCOPIC IMAGE DISPLAY DEVICE

(71) Applicant: Chang-Woong Chu, Yongin (KR)

(72) Inventor: Chang-Woong Chu, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 160 days.

(21) Appl. No.: 13/734,084

(22) Filed: Jan. 4, 2013

(65) Prior Publication Data

US 2013/0176287 A1  Jul. 11, 2013

(30) Foreign Application Priority Data

Jan. 9, 2012 (KR) ........................ 10-2012-0002308

(51) Int. Cl.
| | | |
|---|---|---|
| G02B 27/22 | (2006.01) | |
| G09G 5/00 | (2006.01) | |
| G09G 3/00 | (2006.01) | |
| G02F 1/1335 | (2006.01) | |
| H01L 51/50 | (2006.01) | |
| H01L 27/12 | (2006.01) | |

(52) U.S. Cl.
CPC ........ *G02B 27/2228* (2013.01); *G02B 27/2214* (2013.01); *G09G 5/00* (2013.01); *G02F 1/133512* (2013.01); *G09G 3/003* (2013.01); *H01L 27/1214* (2013.01); *H01L 51/50* (2013.01)

(58) Field of Classification Search
CPC ..................... G02F 1/133512; H04N 13/0402; H04N 13/0409; H04N 13/0415
See application file for complete search history.

(56) References Cited

U.S. PATENT DOCUMENTS

| | | | |
|---|---|---|---|
| 7,916,222 B2 | 3/2011 | Jang et al. | |
| 2003/0107560 A1* | 6/2003 | Yumoto et al. | 345/204 |
| 2003/0197665 A1* | 10/2003 | Sung | 345/82 |
| 2007/0120973 A1 | 5/2007 | Kim et al. | |
| 2009/0051835 A1 | 2/2009 | Park et al. | |
| 2010/0066646 A1* | 3/2010 | Ota | 345/9 |
| 2011/0285612 A1* | 11/2011 | Yamashita et al. | 345/88 |
| 2012/0154696 A1* | 6/2012 | Koyama | 349/15 |
| 2012/0306935 A1* | 12/2012 | Jeong et al. | 345/690 |
| 2013/0050817 A1* | 2/2013 | Sumi | 359/463 |

FOREIGN PATENT DOCUMENTS

| | | |
|---|---|---|
| KR | 10 2006-0001452 A | 1/2006 |
| KR | 10 2006-0011661 A | 2/2006 |
| KR | 10 2007-0056643 A | 6/2007 |
| KR | 10 2009-0020934 A | 2/2009 |

* cited by examiner

*Primary Examiner* — Gerald Johnson
*Assistant Examiner* — Maheen Javed
(74) *Attorney, Agent, or Firm* — Lee & Morse, P.C.

(57) ABSTRACT

A stereoscopic image display device, including: an image displaying unit including a plurality of pixels, the plurality of pixels displaying a left-eye image and a right-eye image, a first light blocking unit having a lattice structure including a plurality of openings corresponding to the plurality of pixels, and a second light blocking unit extending from the first light blocking unit into horizontal center portions of the plurality of openings; and a parallax barrier opposed to the image displaying unit, the parallax barrier including transmitting regions and blocking regions, the transmitting regions and the blocking regions extending in a vertical direction and being alternately disposed to spatially divide the left-eye image and the right-eye image displayed by the image displaying unit.

22 Claims, 6 Drawing Sheets

STEREOSCOPIC IMAGE DISPLAY DEVICE

CROSS REFERENCE TO RELATED APPLICATION

Korean patent Application No. 2012-0002308, filed on Jan. 9, 2012, in the Korean Intellectual Property Office, is incorporated by reference herein in its entirety.

BACKGROUND

1. Field

Example embodiments of the inventive concept relate to stereoscopic image display devices.

2. Description of the Related Art

A stereoscopic image display device provides a sense of depth and a three-dimensional effect to a user by displaying different plane images to a left-eye and a right-eye of the user. The stereoscopic image display device typically displays a stereoscopic image (or a three-dimensional image) using a principle of binocular parallax through two eyes of the user.

The stereoscopic image display device may be classified into a type of using glasses and a type of not using glasses according to the use of glasses. The stereoscopic image display device of the type of not using glasses has a spatial division unit, such as a parallax barrier, in front of an image displaying unit to provide a left-eye image and a right-eye image to the left-eye and the right-eye of the user, respectively.

The parallax barrier includes transparent portions and opaque portions, and performs a spatial division such that the left-eye image is provided to the left-eye of the user, and the right-eye image is provided to the right-eye of the user through the transparent portions.

SUMMARY

One or more embodiments may provide a stereoscopic image display device, including: an image displaying unit including a plurality of pixels, the plurality of pixels displaying a left-eye image and a right-eye image, a first light blocking unit having a lattice structure including a plurality of openings corresponding to the plurality of pixels, and a second light blocking unit extending from the first light blocking unit into horizontal center portions of the plurality of openings; and a parallax barrier opposed to the image displaying unit, the parallax barrier including transmitting regions and blocking regions, the transmitting regions and the blocking regions extending in a vertical direction and being alternately disposed to spatially divide the left-eye image and the right-eye image displayed by the image displaying unit. Boundaries between the transmitting regions and the blocking regions of the parallax barrier may overlap the second light blocking unit. The first light blocking unit may include a vertical pattern extending in the vertical direction and a horizontal pattern extending in a horizontal direction, the vertical pattern and the horizontal pattern intersecting to form the lattice structure, and the second light blocking unit may include a protrusion structure extending in the vertical direction from the horizontal pattern. Each of the plurality of pixels may include a drive transistor and a first electrode electrically coupled to an output electrode of the drive transistor, and the second light blocking unit may overlap a contact region, the output electrode of the drive transistor and the first electrode being connected at the contact region.

Each of the plurality of pixels may further include a switching transistor coupled to a control electrode of the drive transistor; an organic light emitting layer disposed on the first electrode; and a second electrode disposed on the organic light emitting layer.

The stereoscopic image display device may further include a gate line overlapping the first light blocking unit, the gate line extending in a horizontal direction, and being coupled to a control electrode of the switching transistor; a data line overlapping the first light blocking unit, the data line extending in the vertical direction, and being coupled to an input electrode of the switching transistor; and a driving voltage line overlapping the first light blocking unit, the driving voltage line extending in the horizontal direction or in the vertical direction, and being coupled to an input electrode of the drive transistor. The plurality of pixels may include a first pixel configured to display the left-eye image; and a second pixel disposed in a horizontal direction from the first pixel, the second pixel configured to display the right-eye image.

One or more embodiments may provide a stereoscopic image display device, including an image displaying unit including a plurality of pixels that display a left-eye image and a right-eye image, a first light blocking unit having a lattice structure including a plurality of openings corresponding to the plurality of pixels, and a second light blocking unit extending from the first light blocking unit into horizontal center portions of the plurality of openings; and a parallax barrier opposed to the image displaying unit, the parallax barrier including transmitting regions, blocking regions, and boundaries, the transmitting regions and the blocking regions extending in a vertical direction and being alternately disposed, the boundaries overlapping the second light blocking unit. The first light blocking unit may include a vertical pattern extending in the vertical direction and a horizontal pattern extending in a horizontal direction, the vertical pattern and the horizontal pattern intersecting to form the lattice structure, and the second light blocking unit may include a protrusion structure extending in the vertical direction from the horizontal pattern.

Each of the plurality of pixels may include a drive transistor; a switching transistor coupled to a control electrode of the drive transistor; a first electrode electrically coupled to an output electrode of the drive transistor; an organic light emitting layer disposed on the first electrode; and a second electrode disposed on the organic light emitting layer, wherein the second light blocking unit overlaps a contact region, the output electrode of the drive transistor and the first electrode being connected at the contact region.

BRIEF DESCRIPTION OF THE DRAWINGS

Example embodiments can be understood in more detail from the following description taken in conjunction with the accompanying drawings, in which.

DESCRIPTION OF EMBODIMENTS

Figure 1:
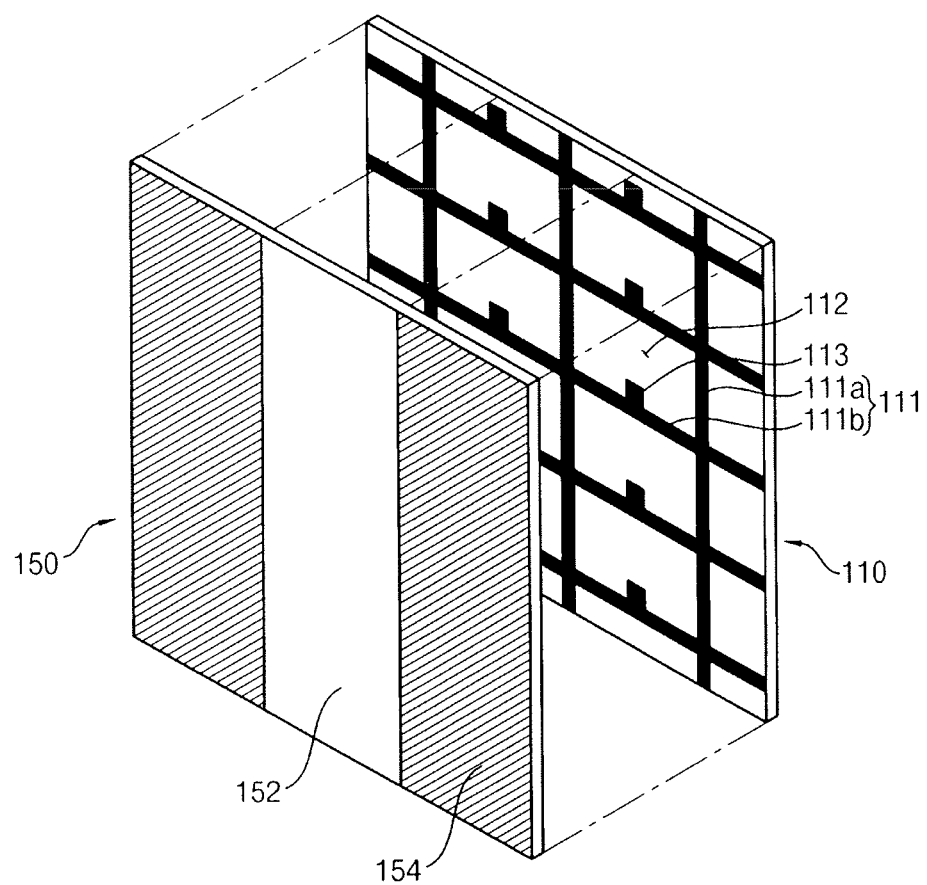
FIG. 1 illustrates an exploded perspective view of a stereoscopic image display device in accordance with example embodiments.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
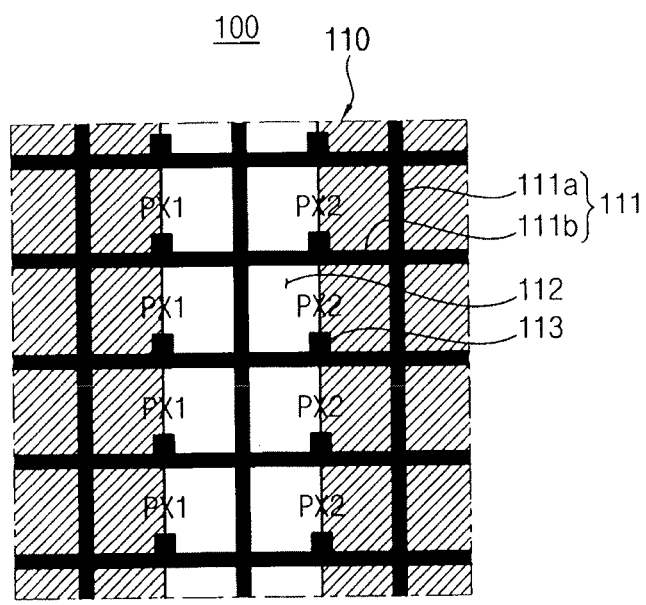
FIG. 2 illustrates a plan view of the stereoscopic image display device in accordance with example embodiments.
Figure 3:
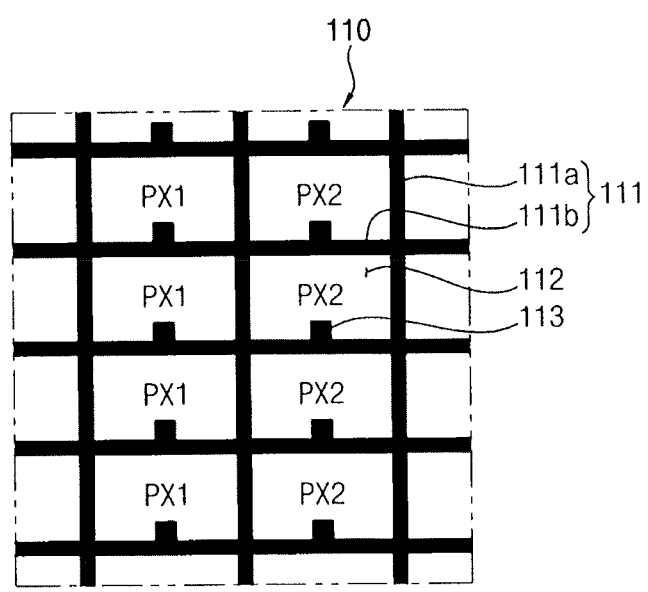
FIG. 3 illustrates a plan view of an image displaying unit included in the stereoscopic image display device in accordance with example embodiments.

FIG. 1 illustrates an exploded perspective view of a stereoscopic image display device in accordance with example embodiments. FIG. 2 illustrates a plan view of a stereoscopic image display device in accordance with example embodiments. FIG. 3 illustrates a plan view of an image displaying unit included in a stereoscopic image display device in accordance with example embodiments.

Referring to FIGS. 1, 2 and 3, a stereoscopic image display device 100 may include an image displaying unit 110 and a parallax barrier 150.

The parallax barrier 150 may be opposed to or opposite the image displaying unit 110, and may be disposed over a surface of the image displaying unit 110 where an image is displayed. The image displaying unit 110 may display a left-eye image and a right-eye image to provide a stereoscopic image (or a three-dimensional image) to a user. Within one display frame, the left-eye image and the right-eye image may be displayed alternately in a horizontal direction. For example, odd-numbered columns of pixels may display the left-eye image, and even-numbered columns of pixels may display the right-eye image. The parallax barrier 150 may perform a spatial division such that the left-eye image is observed by a left-eye of the user, and the right-eye image is observed by a right-eye of the user. Since the left-eye image and the right-eye image are observed by the left-eye and the right-eye, respectively, the user may sense the stereoscopic image.

The image displaying unit 110 may include a plurality of signal lines (not shown), a plurality of pixels PX1 and PX2, a first light blocking unit 111 and a second light blocking unit 113. The plurality of pixels PX1 and PX2 may be electrically coupled to the plurality of signal lines. The first and second light blocking units 111 and 113 may block light. For example, a region in which the first and second light blocking units 111 and 113 are disposed may be defined as a non-displaying region (or a non-light emitting region).

The plurality of signal lines may overlap the first light blocking unit 111. The plurality of signal lines may be electrically coupled to the plurality of pixels PX1 and PX2, and control signals for controlling operations of the plurality of pixels PX1 and PX2 may be transmitted through the plurality of signal lines.

The plurality of pixels PX1 and PX2 may include a first pixel PX1 that displays the left-eye image and a second pixel PX2 that displays the right-eye image. The first and second pixels PX1 and PX2 may be alternately disposed in the horizontal direction. The plurality of pixels PX1 and PX2 and the plurality of signal lines are described below with reference to FIGS. 4A to 4C.

The first light blocking unit 111 may have a lattice structure including a plurality of openings 112 respectively corresponding to the plurality of pixels PX1 and PX2. For example, the first light blocking unit 111 may include a vertical pattern 111a extending in a vertical direction, and a horizontal pattern 111b intersecting the vertical pattern 111a and extending in a horizontal direction. The vertical pattern 111a and the horizontal pattern 111b may be perpendicular to each other. The plurality of pixels PX1 and PX2 may be disposed at the plurality of openings 112 of the first light blocking unit 111, respectively.

The second light blocking unit 113 may be disposed at the respective openings of the first light blocking unit 111. The second light blocking unit 113 may extend from the first light blocking unit 111. For example, the second light blocking unit 113 may include a protrusion structure extending in the vertical direction. For example, the protrusion structure may extend in the vertical direction from the horizontal pattern 111b of the first light blocking unit 111. As illustrated in FIGS. 1 to 3, the second light blocking unit 113 may extend from the horizontal pattern 111b below or above each opening 112. In some example embodiments, the second light blocking unit 113 may be integrally formed with the first light blocking unit 111 from which the second light blocking unit 113 extends. In other example embodiments, the second light blocking unit 113 may have an island structure inside the respective openings 112. For example, only one side of the second blocking unit 113 may be in direct contact with the first light blocking unit 111.

The second light blocking unit 113 may be at a horizontal center portion of the respective openings 112. For example, the second light blocking unit 113 may be located such that each opening 112 has a bilateral symmetry with respect to the second light blocking unit 113. Thus, the second light blocking unit 113 may at least partially divide the respective openings 112 in half.

As described above, the first light blocking unit 111 may have the lattice structure including the plurality of openings 112, and the second light blocking unit 113 may be located at the horizontal center portions of the respective openings 112. As such, each pixel PX1 and PX2, defined by the first and second light blocking units 111 and 113, may have a bilateral symmetry. Thus, a displaying region (or a light emitting region) of each pixel PX1 and PX2, in which the first and second light blocking units 111 and 113 are not disposed, may have a bilateral symmetry.

Since the displaying region of each pixel PX1 and PX2 has bilateral symmetry, a size of an effective displaying region of the first pixel PX1 may be substantially the same as a size of an effective displaying region of the second pixel PX2, although portions of the first and second pixels PX1 and PX2 blocked by the parallax barrier 150 may be different from each other. Accordingly, brightness of images observed by the left-eye and the right-eye of the user may be uniform. For example, although a left portion of the first pixel PX1 may be blocked by the parallax barrier 150 and a right portion of the second pixel PX2 may be blocked by the parallax barrier 150, the effective displaying regions of the first and second pixels PX1 and PX2 observed by the left-eye and the right-eye of the user may have substantially the same size. Accordingly, the images observed by the left-eye and the right-eye of the user may have substantially the same brightness. Accordingly, the stereoscopic image display device 110 according to example embodiments may improve brightness uniformity of images observed by the left-eye and right-eye of the user, and may provide a stereoscopic image of improved quality to the user.

The image displaying unit 110 may include a plurality of pixels PX1 and PX2 that are arranged in a matrix form. According to some embodiments, the image displaying unit 110 may be an organic light emitting device (OLED), a liquid crystal display (LCD), a plasma display panel (PDP), or the like.

An example of the image displaying unit 110 that is an OLED will be described below. The plurality of pixels PX1 and PX2 may have substantially the same structure. Thus, a structure of one pixel will be described below.

Figure 4A:
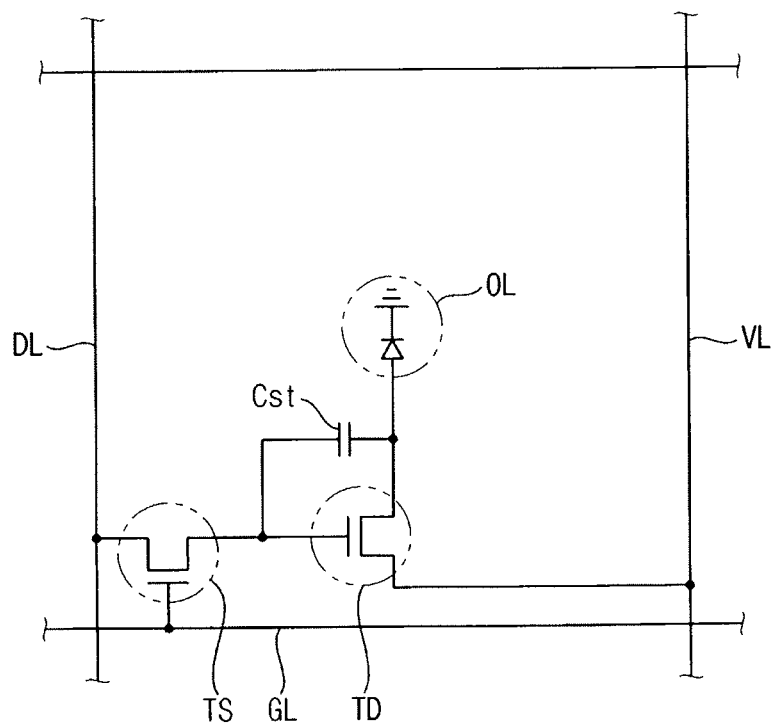
FIG. 4A illustrates a circuit diagram of a pixel included in the image displaying unit in accordance with example embodiments.
Figure 4B:
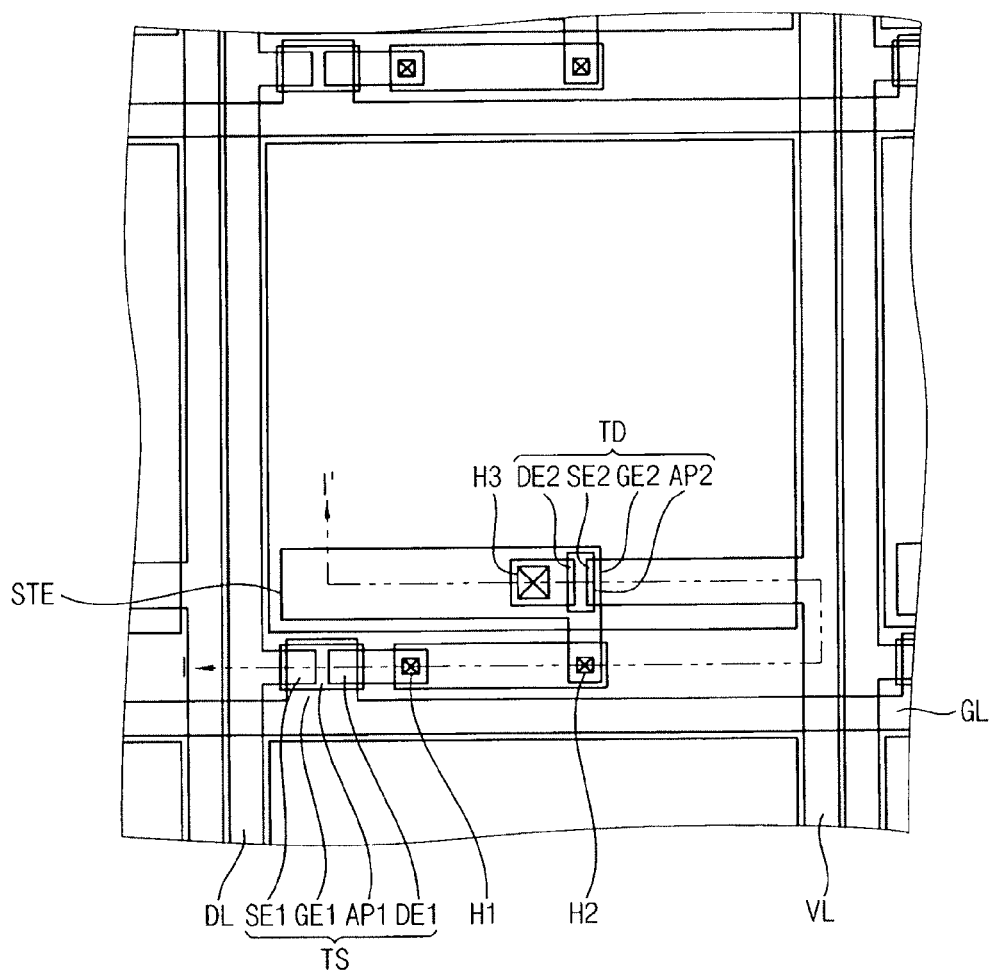
FIG. 4B illustrates a plan view of a pixel included in the image displaying unit in accordance with example embodiments.
Figure 4C:
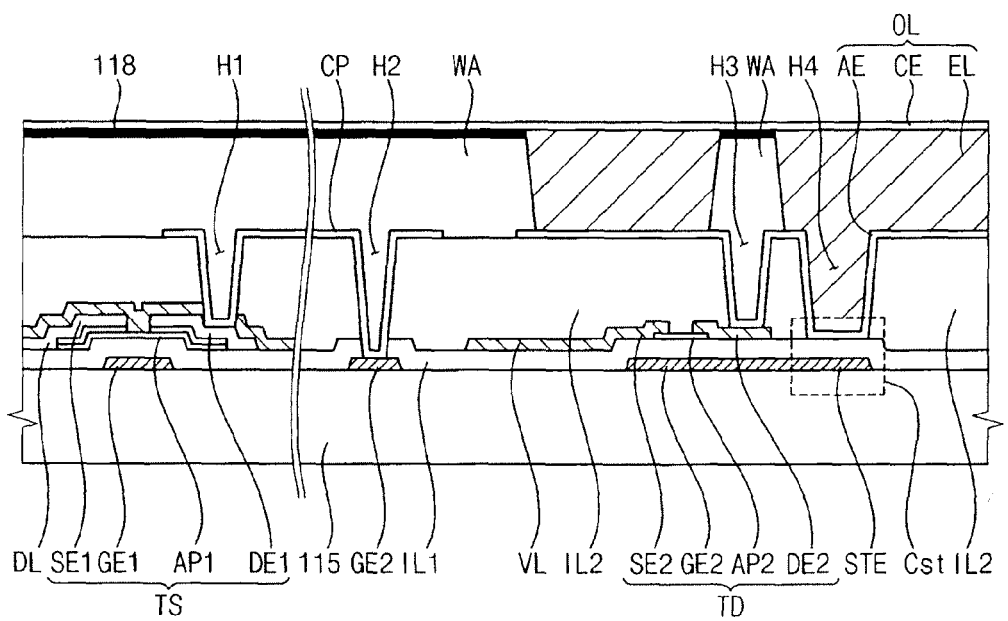
FIG. 4C illustrates a cross-sectional view taken along a line I-I' in FIG. 4B.

FIG. 4A illustrates a circuit diagram of a pixel included in an image displaying unit in accordance with example embodiments. FIG. 4B illustrates a plan view of a pixel included in an image displaying unit in accordance with example embodiments. FIG. 4C illustrates a cross-sectional view taken along a line I-I' in FIG. 4B.

Referring to FIGS. 4A to 4C, an image displaying unit includes a plurality of signal lines GL, DL and VL. The plurality of signal lines GL, DL and VL may be electrically coupled to a pixel. The plurality of signal lines GL, DL and VL may include a gate line GL, a data line DL and a driving voltage line VL.

The image displaying unit may include a display substrate 115 where the plurality of signal lines GL, DL and VL are formed. A first insulation layer IL1 may be formed on the gate line GL, a second insulation layer IL2 may be formed on the data line DL and the driving voltage line VL, and an isolation wall WA may be formed on the second insulation layer IL2. The isolation wall WA may substantially define a boundary of the pixel.

A gate signal (or a scan signal) may be transmitted through the gate line GL. For example, the gate line GL may extend in a horizontal direction. Although two gate lines GL are illustrated in FIGS. 4A and 4B, the image displaying unit may include a plurality of gate lines GL that are disposed in parallel.

A data signal may be transmitted through the data line DL. For example, the data line DL may extend in a vertical direction, and may cross, e.g., intersect, the gate line GL. Although one data line DL is illustrated in FIGS. 4A and 4B, the image displaying unit may include a plurality of data lines DL that are disposed in parallel.

A driving voltage ELVDD may be transmitted through the driving voltage line VL. For example, the driving voltage line VL may extend in the vertical direction in parallel with the data line DL. Alternatively, the driving voltage line VL may extend in the horizontal direction in parallel with the gate line GL.

The pixel may include a switching transistor TS, a drive transistor TD, a storage capacitor Cst and an organic light emitting diode OL. The organic light emitting diode OL may include a first electrode AE, an organic light emitting layer EL and a second electrode CE.

The switching transistor TS may have a first control electrode GE1, a first input electrode SE1 and a first output electrode DE1. The first control electrode GE1 may be coupled to the gate line GL, the first input electrode SE1 may be coupled to the date line DL, and the first output electrode DE1 may be coupled to the drive transistor TD. The switching transistor TS may include a first active pattern AP1 that overlaps the first control electrode GE1 and partially overlaps the first input electrode SE1 at one end and the first output electrode DE1 at the other end. The switching transistor TS may transfer the data signal transmitted through the data line DL to the drive transistor TD in response to the gate signal transmitted through the gate line GL.

The drive transistor TD may have a second control electrode GE2, a second input electrode SE2 and a second output electrode DE2. The second control electrode GE2 may be coupled to the first output electrode DE of the switching transistor TS, the second input electrode SE2 may be coupled to the driving voltage line VL, and the second output electrode DE2 may be coupled to the first electrode AE of the organic light emitting diode OL. The drive transistor TD may include a second active pattern AP2 that overlaps, e.g., at least partially overlaps, the second control electrode GE2 and partially overlaps the second input electrode SE2 at one end and the second output electrode DE2 at the other end. The second control electrode GE2 of the drive transistor TD may be electrically coupled to the first output electrode DE of the switching transistor TS via a connection pattern CP. The connection pattern CP may contact the first output electrode DE1 and the second control electrode GE2 via a first contact hole H1 and a second contact hole H2 formed through the second insulation layer IL2, respectively. The drive transistor TD may provide a driving current to the first electrode AE of the organic light emitting diode OL according to the data signal provided through the switching transistor TS.

The storage capacitor Cst may be coupled between the second control electrode GE2 and the second output electrode DE2 of the drive transistor TD. The storage capacitor Cst may substantially maintain a voltage of the second control electrode GE2 of the drive transistor TD. Thus, the second control electrode GE2 of the drive transistor TD may have a voltage substantially the same as a voltage of the data signal during a predetermined period. The storage capacitor Cst may include a storage electrode STE, a portion of the first electrode AE that overlaps the storage electrode STE, and the first insulation layer IL1 between the storage electrode STE and the portion of the first electrode AE. As described above, the storage capacitor Cst may be coupled between the second control electrode GE2 and the second output electrode DE2. Alternatively, the storage capacitor Cst may be coupled between the second control electrode GE2 and the second input electrode SE2.

The organic light emitting diode OL may be electrically coupled to the drive transistor TD. The organic light emitting diode OL may include the first electrode AE, the organic light emitting layer EL formed on the first electrode AE, and the second electrode CE formed on the organic light emitting layer EL. The first and second electrodes AE and CE may be an anode electrode and a cathode electrode, respectively. The first electrode AE may provide a hole H4 to the organic light emitting layer EL, and the second electrode CE may provide an electron to the organic light emitting layer EL. The hole and the electron may be combined to form an excitation in the organic light emitting layer EL, and thus may emit light. A common voltage ELVSS may be provided to the second electrode CE of the organic light emitting diode OL. Although not illustrated, the organic light emitting diode OL may further include a hole injection layer, a hole transferring layer, an electron injection layer and/or an electron transferring layer between the first and second electrodes AE and CE.

The first electrode AE of the organic light emitting diode OL may be electrically coupled to the second output electrode DE2 of the drive transistor TD via a third contact hole H3 formed through the second insulation layer IL2. The third contact hole H3 may be located at a horizontal center portion of a displaying region (or a light emitting region) of the pixel. For example, a contact region at which the first electrode AE and the second output electrode DE2 are connected may be located at the horizontal center portion of the displaying region between the data line DL and the driving voltage line VL. Thus, the displaying region of the pixel may have a bilateral symmetry.

The displaying region of the pixel may be determined as a region of the organic light emitting layer EL. A boundary of the region of the organic light emitting layer EL may be defined by the isolation wall WA. The isolation wall WA may overlap the signal lines GL, DL and VL, the switching transistor TS and the connection pattern CP. The isolation wall WA may further overlap the third contact hole H3, or the contact region where the first electrode AE of the organic light emitting diode OL and the second output electrode DE2 of the drive transistor TD are connected.

The isolation wall WA may substantially separate a plurality of pixels. A shape of the isolation wall WA may be substantially the same as a shape of first and second light blocking units 111 and 113 described above with reference to FIGS. 1 and 2.

The image displaying unit may include a light blocking pattern 118 on the isolation wall WA as the first and second light blocking units 111 and 113 illustrated in FIGS. 1 and 2. For example, the first and second light blocking units 111 and 113 may be defined by the light blocking pattern 118. The light blocking pattern 118 may include an opaque material. For example, the light blocking pattern 118 may include a black matrix.

Although it is not illustrated, the image displaying unit may further include a protective substrate opposed to the display substrate 115. The protective substrate may be a transparent substrate.

As described above, the image displaying unit may include the light blocking pattern 118 as the first and second light blocking units 111 and 113 illustrated in FIGS. 1 and 2. Alternatively, in some example embodiment, the isolation wall WA may be formed of an opaque material, and the opaque isolation wall WA may correspond to the first and second light blocking units 111 and 113 illustrated in FIGS. 1 and 2. In other example embodiments, a black matrix pattern may be formed beneath a lower surface of the protective substrate as the first and second light blocking units 111 and 113 illustrated in FIGS. 1 and 2.

Figure 5:
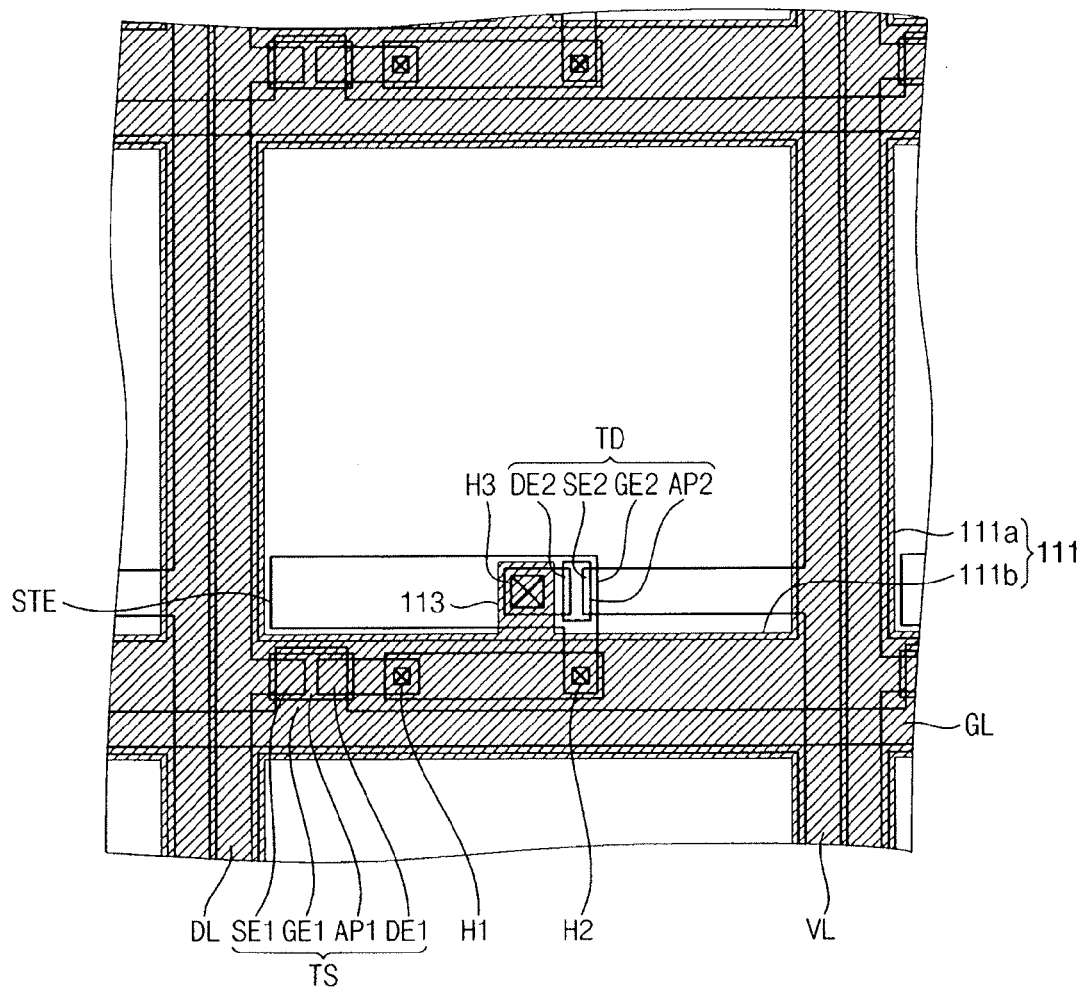
FIG. 5 illustrates a diagram of a first light blocking unit, a second light blocking unit and a pixel illustrated in FIG. 4B.

FIG. 5 illustrates a diagram of the first light blocking unit, the second light blocking unit and the pixel illustrated in FIG. 4B.

Referring to FIGS. 4A, 4B, 4C and 5, first and second light blocking units 111 and 113 may define each pixel.

The first and second light blocking units 111 and 113 may be formed on an isolation wall WA. For example, the first light blocking unit 111 may overlap signal lines GL, DL and VL, or a gate line GL, a data line DL and a driving voltage line VL. The first light blocking unit 111 may further overlap a switching transistor TS and a connection pattern CP. The vertical pattern 111*a* of the first light blocking unit 111 may overlap the data line DL and the driving voltage line VL, and the horizontal pattern 111*b* of the first light blocking unit 111 may overlap the gate line GL, the switching transistor TS and the connection pattern CP.

The second light blocking unit 113 may overlap a third contact hole H3. That is, the second light blocking unit 113 may overlap a contact region in which a second output electrode DE of a drive transistor TD and a first electrode AE of an organic light emitting diode OL are connected.

Hereinafter, the parallax barrier 150 will be described below with reference to FIGS. 1, 2 and 3.

The parallax barrier 150 may be opposed to the image displaying unit 110. The parallax barrier 150 may be spaced apart from the image displaying unit 110 by a predetermined distance, and may be disposed over a surface of the image displaying unit 110 where an image is displayed. The parallax barrier 150 may perform a spatial division such that a left-eye image and a right-eye image displayed by the image displaying unit 110 are observed by a left-eye and a right-eye of a user, respectively.

The parallax barrier 150 may include transmitting regions 152 where light is transmitted and blocking regions 154 where light is blocked to perform the spatial division. The transmitting regions 152 and the blocking regions 154 may extend in a vertical direction and may appear as stripes, e.g. may have a rectangular shape. Further, the transmitting regions 152 and the blocking regions 154 may be alternately disposed in a horizontal direction. For example, the transmitting regions 152 may be transparent regions, and the blocking regions 154 may be opaque regions. With respect to the left-eye of the user, the left-eye image may reach the left-eye through the transmitting regions 152, and the right-eye image may be blocked by the blocking regions 154 and thereby prevented from reaching the left-eye. With respect to the right-eye of the user, the right-eye image may reach the right-eye through the transmitting regions 152, and the left-eye image may be blocked by the blocking regions 154 and thereby prevented from reaching the right-eye. Since the left-eye image and the right-eye image are observed by the left-eye and the right-eye, respectively, the user may perceive a stereoscopic image.

Boundaries between the transmitting regions 152 and the blocking regions 154 of the parallax barrier 150 may overlap the second light blocking unit 113 of the image displaying unit 110. As such, an effective displaying region of each pixel PX1 and PX2 may correspond to either a left displaying region with respect to the second light blocking unit 113 or a right displaying region with respect to the second light blocking unit 113. The left displaying region and the right displaying region may have substantially the same size. For example, a size of an effective displaying region observed by the left-eye and a size of an effective displaying region observed by the right-eye may be substantially the same as each other although portions of the pixels PX1 and PX2 observed by the left-eye and the right-eye may be different from each other. As such, brightness of images observed by the left-eye and the right-eye of the user may be uniform. Accordingly, the stereoscopic image display device 110 according to example embodiments may improve brightness uniformity of the images observed by the left-eye and the right-eye of the user, and may provide a stereoscopic image of improved quality to the user.

In some example embodiments, the transmitting regions 152 and the blocking regions 154 of the parallax barrier 150 may be fixed, e.g., not subject to change. In other example embodiments, positions of the transmitting regions 152 and the blocking regions 154 may be changed by selectively forming the transmitting regions 152 and/or the blocking regions 154 using a liquid crystal. For example, the parallax barrier 150 may be a liquid crystal panel that selectively forms the blocking regions 154.

The stereoscopic image display device 100 may selectively display a plane image (a two-dimensional image) or a stereoscopic image (a three-dimensional image). In embodiments in which the transmitting regions 152 and the blocking regions 154 of the parallax barrier 150 are fixed, the stereoscopic image display device 100 may display the plane image by displaying the same plane image at the first and second pixels PX1 and PX2, and may display the stereoscopic image by displaying the left-eye image at the first pixel PX1 and the right-eye image at the second pixel PX2. In embodiments in which the parallax barrier 150 selectively forms the blocking regions 154, the stereoscopic image display device 100 may display the plane image by removing the blocking regions 154, and may display the stereoscopic image by forming the blocking regions 154.

By way of summation and review, in a general stereoscopic image display device having a parallax barrier, an effective aperture ratio of a pixel may be determined according to a size of the pixel observed through the transparent portions, and sizes of pixels observed by the left-eye and the right-eye may be different from each other. For example, a contact region where a switching device and an electrode are connected, which is a non-displaying region (or a non-light emitting region), may be located at a left side or a right side of the pixel. If the contact region is located at one side of the pixel, the contact region may be observed by one eye of the user, and may not be observed by the other eye of the user. In this case, the sizes of pixels observed by the left-eye and the right-eye may be different from each other, and brightness of images observed by the left-eye and the right-eye of the user may be different from each other. Such brightness non-uniformity of images observed by the left-eye and the right-eye may deteriorate a quality of the stereoscopic image.

In contrast, the stereoscopic image display device according to embodiments may be capable of improving brightness uniformity of images observed by a left-eye and a right-eye of a user, and may provide a stereoscopic image of an improved quality to the user.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A stereoscopic image display device, comprising:
   an image displaying unit including:
      a plurality of pixels including a first pixel to display light corresponding to a left-eye image and a second pixel to display light corresponding to a right-eye image, the first pixel adjacent to the second pixel,
      a first light blocking area having a lattice structure including a plurality of openings corresponding to the plurality of pixels, and
      a second light blocking areas extending from the first light blocking area toward horizontal center portions of respective ones of the plurality of openings; and
   a parallax barrier opposite to the image displaying unit, the parallax barrier including transmitting regions and blocking regions, the transmitting regions and the blocking regions extending in a vertical direction and being alternately disposed to spatially divide the left-eye image and the right-eye image displayed by the image displaying unit, wherein each of the first and second pixels, defined by the first and second light-blocking areas, has a bilateral symmetry relative to a boundary between the adjacent first and second pixels, wherein one of the transmitting regions partially overlaps the first and second pixels such that an effective displaying region of the first pixel has substantially a same size as an effective displaying region of the second pixel based on the bilateral symmetry, and wherein the blocking regions block different portions of the first and second pixels.

2. The stereoscopic image display device of claim 1, wherein each of the plurality of pixels includes a drive transistor and a first electrode electrically coupled to an output electrode of the drive transistor, and wherein each of the second light blocking areas overlaps a contact region, the output electrode of the drive transistor and the first electrode being connected at the contact region.

3. The stereoscopic image display device of claim 2, wherein each of the plurality of pixels further includes:
  a switching transistor coupled to a control electrode of the drive transistor;
  an organic light emitting layer disposed on the first electrode; and
  a second electrode disposed on the organic light emitting layer.

4. The stereoscopic image display device of claim 3, further comprising:
  a gate line overlapping the first light blocking area, the gate line extending in a horizontal direction, and being coupled to a control electrode of the switching transistor;
  a data line overlapping the first light blocking area, the data line extending in the vertical direction, and being coupled to an input electrode of the switching transistor; and
  a driving voltage line overlapping the first light blocking area, the driving voltage line extending in the horizontal direction or in the vertical direction, and being coupled to an input electrode of the drive transistor.

5. The stereoscopic image display device of claim 1, wherein the second pixel is disposed in a horizontal direction from the first pixel.

6. The stereoscopic image display device of claim 1, wherein boundaries between the transmitting regions and the blocking regions of the parallax barrier overlap the second light blocking areas.

7. The stereoscopic image display device of claim 1, wherein the first light blocking area includes a vertical pattern extending in the vertical direction and a horizontal pattern extending in a horizontal direction, the vertical pattern and the horizontal pattern intersecting to form the lattice structure, and wherein each of the second light blocking areas includes a protrusion structure extending in the vertical direction from the horizontal pattern.

8. The stereoscopic image display device of claim 1, wherein the different portions of the first and second pixels blocked by the blocking regions are substantially equal in size.

9. The stereoscopic image display device of claim 1, wherein the second blocking area in each of the pixels extends to a perimeter of each of the pixels.

10. The stereoscopic image display device of claim 1, wherein a boundary between one of the transmitting regions and one of the blocking regions is aligned with an axis of at least one of the first or second pixels, the axis dividing the at least one of the first or second pixels into equal halves.

11. The stereoscopic image display device of claim 1, wherein the second light blocking areas do not overlap storage capacitors of corresponding ones of the first pixel and the second pixel.

12. A stereoscopic image display device, comprising:
  an image displaying unit including:
    a plurality of pixels including a first pixel to display a left-eye image and a second pixel to display a right-eye image, the first pixel adjacent to the second pixel,
    a first light blocking area having a lattice structure including a plurality of openings corresponding to the plurality of pixels, and
    second light blocking areas extending from the first light blocking area toward horizontal center portions of the plurality of openings; and
  a parallax barrier opposite to the image displaying unit, the parallax barrier including transmitting regions, blocking regions, and boundaries between the transmitting regions and the blocking regions, the transmitting regions and the blocking regions extending in a vertical direction and being alternately disposed, the boundaries overlapping the second light blocking area, wherein each of the first and second pixels, defined by the first and second light-blocking areas, has a bilateral symmetry relative to a boundary between the adjacent first and second pixels,
  wherein one of the transmitting regions partially overlaps the first and second pixels to allow an effective displaying region of the first pixel to have substantially a same size as an effective displaying region of the second pixel based on the bilateral symmetry, and wherein the blocking regions block different portions of the first and second pixels.

13. The stereoscopic image display device of claim 12, wherein the first light blocking area includes a vertical pattern extending in the vertical direction and a horizontal pattern extending in a horizontal direction, the vertical pattern and the horizontal pattern intersecting to form the lattice structure, and wherein each of the second light blocking areas includes a protrusion structure extending in the vertical direction from the horizontal pattern.

14. The stereoscopic image display device of claim 13, wherein each of the plurality of pixels includes:
  a drive transistor;
  a switching transistor coupled to a control electrode of the drive transistor;
  a first electrode electrically coupled to an output electrode of the drive transistor;
  an organic light emitting layer disposed on the first electrode; and
  a second electrode disposed on the organic light emitting layer,
  wherein each of the second light blocking areas overlaps a contact region, the output electrode of the drive transistor and the first electrode being connected at the contact region.

15. A stereoscopic image display device, comprising:
  a first pixel to display light of a left-eye image;
  a second pixel to display light of a right-eye image;
  a first light blocking area having a lattice structure including a plurality of openings to block light from respective ones of the first and second pixels;
  second light blocking areas extending from the first light blocking area, each of the second light blocking areas extending toward horizontal center portions of respective ones of the plurality of openings; and a parallax barrier including at least one transmitting region and a plurality of blocking regions, wherein the transmitting region partially overlaps the first and second pixels such that an effective display region of the first pixel has substantially a same size as an effective display region of the second pixel, wherein each of the first and second pixels has a bilateral symmetry relative to a boundary between the first and second pixels, wherein the transmitting region partially overlaps the first and second pixels such that an effective display region of the first pixel has substantially a same size as an effective display region of the second pixel, and wherein the blocking regions block different portions of the first and second pixels.

16. The stereoscopic image display device as claimed in claim 15, wherein the second light blocking areas are to block light from respective ones of the first and second pixels, the second light blocking areas adjacent to respective ones of the first areas.

17. The stereoscopic image display device as claimed in claim 16, wherein: a boundary between the transmitting region and the blocking region is aligned to divide at least one of the first or second pixels into a non-display region and a corresponding one of the effective display regions, and a size of the non-display region is substantially equal to half a size of the effective display region.

18. The stereoscopic image display device as claimed in claim 17, wherein the boundary overlaps one of the second light blocking areas corresponding to the at least one of the first or second pixels.

19. The stereoscopic image display device as claimed in claim 16, wherein the different portions of the first and second pixels blocked by the first and second light blocking areas are substantially equal in size.

20. The stereoscopic image display device as claimed in claim 15, wherein the effective display region of the first pixel is adjacent to the effective display region of the second pixel.

21. The stereoscopic image display device as claimed in claim 20, wherein a portion of the first light blocking area is between the effective display regions of the first and second pixels, the portion commonly shared to block light from the first and second pixels.

22. The stereoscopic image display device of claim 15, wherein the second light blocking areas do not overlap storage capacitors of corresponding ones of the first pixel and the second pixel.

* * * * *